(12) United States Patent
Imada et al.

(10) Patent No.: US 10,057,970 B2
(45) Date of Patent: Aug. 21, 2018

(54) ESD PROTECTION DEVICE

(71) Applicant: Murata Manufacturing Co., Ltd., Kyoto (JP)

(72) Inventors: Takayuki Imada, Kyoto (JP); Takayuki Tsukizawa, Kyoto (JP); Jun Adachi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 485 days.

(21) Appl. No.: 14/922,417

(22) Filed: Oct. 26, 2015

(65) Prior Publication Data

US 2016/0044769 A1  Feb. 11, 2016

Related U.S. Application Data

(63) Continuation of application No. PCT/JP2014/059643, filed on Apr. 1, 2014.

(30) Foreign Application Priority Data

May 8, 2013 (JP) .................................. 2013-098264

(51) Int. Cl.
*H05F 3/00* (2006.01)
*H05F 3/04* (2006.01)
(Continued)

(52) U.S. Cl.
CPC ................. *H05F 3/04* (2013.01); *H01T 1/22* (2013.01); *H01T 4/10* (2013.01); *H05K 1/026* (2013.01);
(Continued)

(58) Field of Classification Search
CPC ....................................................... H05F 3/04
See application file for complete search history.

(56) References Cited

U.S. PATENT DOCUMENTS 5,594,613 A * 1/1997 Woodworth ............. H01C 7/12
361/117
7,633,735 B2 12/2009 Urakawa
(Continued)

FOREIGN PATENT DOCUMENTS

JP   2002-260812 A   9/2002
JP   2007-317542 A   6/2007
(Continued)

OTHER PUBLICATIONS

International Search Report for PCT/JP2014/059643 dated May 13, 2014.
Translation of Written Opinion for PCT/JP2014/059643 dated May 13, 2014.

*Primary Examiner* — Stephen W Jackson
(74) *Attorney, Agent, or Firm* — Pearne & Gordon LLP

(57) ABSTRACT

There is provided an ESD protection device capable of lowering a discharge starting voltage. An ESD protection device 1 includes a ceramic multilayer substrate 2, a first discharge electrode 4 and a second discharge electrode 5 arranged at a height position of the ceramic multilayer substrate, an end 4a of the first discharge electrode 4 and an end 5a of the second discharge electrode 5 facing each other, in which each of the first discharge electrode 4 and the second discharge electrode 5 contains a metal and a shrinkage suppression material having a lower rate of shrinkage than that of the metal at a temperature at which firing for the production of the ceramic multilayer substrate 2 is performed.

7 Claims, 1 Drawing Sheet

(51) Int. Cl.
  H01T 4/10  (2006.01)
  H01T 1/22  (2006.01)
  H05K 9/00  (2006.01)
  *H01T 4/12*  (2006.01)
  *H05K 1/02*  (2006.01)
  *H05K 1/03*  (2006.01)
  *H05K 1/09*  (2006.01)
  *H05K 3/12*  (2006.01)
  *H05K 3/46*  (2006.01)

(52) U.S. Cl.
  CPC .............. H05K 9/0067 (2013.01); *H01T 4/12* (2013.01); *H05K 1/0259* (2013.01); *H05K 1/0306* (2013.01); *H05K 1/092* (2013.01); *H05K 3/1291* (2013.01); *H05K 3/4629* (2013.01); *H05K 2201/0209* (2013.01); *H05K 2203/308* (2013.01)

(56) References Cited

U.S. PATENT DOCUMENTS

| | | |
|---|---|---|
| 8,238,069 B2 | 8/2012 | Adachi et al. |
| 8,693,157 B2 | 4/2014 | Noma et al. |
| 8,711,537 B2 * | 4/2014 | Adachi ............... H01T 4/12 361/111 |
| 8,717,730 B2 | 5/2014 | Ikeda |
| 2011/0286142 A1 | 11/2011 | Ikeda |

FOREIGN PATENT DOCUMENTS

| | | |
|---|---|---|
| JP | 2011-243492 A | 12/2011 |
| WO | 2008/146514 A1 | 4/2008 |
| WO | 2009/098944 A1 | 8/2009 |
| WO | 2009/136535 A1 | 12/2009 |

* cited by examiner

ESD PROTECTION DEVICE

BACKGROUND OF THE DISCLOSURE

Field of the Disclosure

The present disclosure relates to an electro-static discharge (ESD) protection device configured to protect an electronic apparatus from ESD, more particularly, to an ESD protection device in which an end of a first discharge electrode and an end of a second discharge electrode face each other inside a ceramic multilayer substrate.

Description of the Related Art

ESD protection devices are required to protect electronic apparatuses from ESD with a lower voltage. Patent Document 1 described below discloses an ESD protection device that can lower a discharge starting voltage. In each of Patent Documents 1 and 2, at least one pair of discharge electrodes is arranged in a ceramic multilayer substrate. Ends of the at least one discharge electrodes face each other with a gap provided therebetween. An auxiliary electrode is arranged so as to connect the discharge electrodes to each other, the auxiliary electrode containing a ceramic material and a conductive material coated with a non-conductive material.

Patent Document 1: International Publication No. WO2008/146514

Patent Document 2: International Publication No. WO2009/136535

BRIEF SUMMARY OF THE DISCLOSURE

In a traditional ESD protection device, discharge electrodes are liable to shrink significantly during firing for the production of a ceramic multilayer substrate. Thus, the gap between the ends of the discharge electrodes are increased, thereby disadvantageously increasing a discharge starting voltage.

It is an object of the present disclosure to provide an ESD protection device capable of lowering a discharge starting voltage.

An ESD protection device according to the present disclosure includes a ceramic multilayer substrate, a first discharge electrode, and a second discharge electrode. The first discharge electrode and the second discharge electrode are arranged at a height position of the ceramic multilayer substrate, an end of the first discharge electrode and an end of the second discharge electrode facing each other. In the present disclosure, each of the first discharge electrode and the second discharge electrode contains a metal and a shrinkage suppression material having a lower rate of shrinkage than that of the metal at a temperature at which firing for the production of the ceramic multilayer substrate is performed.

In the ESD protection device according to the present disclosure, the shrinkage suppression material is preferably composed of an inorganic substance having a higher sintering temperature than that of the metal contained in each of the first discharge electrode and the second discharge electrode.

In the ESD protection device according to the present disclosure, the shrinkage suppression material may be a semiconductor. In this case, the discharge starting voltage is further effectively reduced.

In the ESD protection device according to the present disclosure, the shrinkage suppression material may be an insulating material.

Preferably, the ESD protection device according to the present disclosure further includes an auxiliary electrode arranged in the ceramic multilayer substrate, the auxiliary electrode being connected to the first discharge electrode and the second discharge electrode, in which the auxiliary electrode contains a conductive material coated with an insulating material. In this case, the discharge starting voltage is further reduced.

The auxiliary electrode may further contain a ceramic material. More preferably, the ceramic material may be a semiconductor ceramic.

In the ESD protection device according to the present disclosure, each of the first discharge electrode and the second discharge electrode contains the shrinkage suppression material. It is thus possible to suppress the shrinkage of the first discharge electrode and the second discharge electrode during the firing for the production of the ceramic multilayer substrate. Hence, in the case where the end of the first discharge electrode and the end of the second discharge electrode face each other, the gap therebetween is less likely to increase during the firing. This enables the discharge starting voltage to be effectively reduced.

DETAILED DESCRIPTION OF THE DISCLOSURE

The present disclosure will be described below with reference to the drawings by explaining specific embodiments of the present disclosure.

Figure 1:
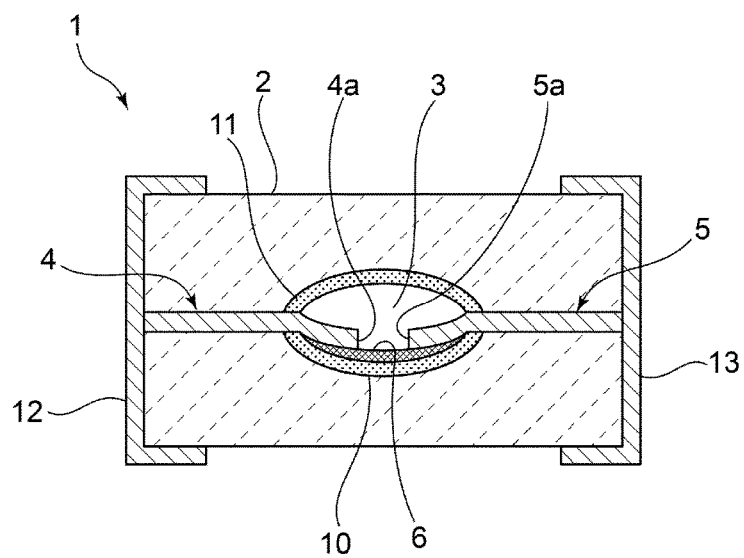
FIG. 1 is a front sectional view of an ESD protection device according to an embodiment of the present disclosure.

FIG. 1 is a front sectional view of an ESD protection device according to an embodiment of the present disclosure.

An ESD protection device 1 includes a ceramic multilayer substrate 2. The ceramic multilayer substrate 2 has a rectangular parallelepiped-like shape in this embodiment. A cavity 3 is provided inside the ceramic multilayer substrate 2.

A first discharge electrode 4 and a second discharge electrode 5 are arranged on a plane at a height position in the ceramic multilayer substrate 2. An end 4a of the first discharge electrode 4 and an end 5a of the second discharge electrode 5 face each other in the cavity 3. A portion where the end 4a and the end 5a face each other is referred to as a facing portion.

The cavity 3 may be formed by the use of a resin paste that disappears when firing for the production of the ceramic multilayer substrate 2 is performed. That is, the resin paste is incorporated into a ceramic green sheet multilayer body. When the firing for the production of the ceramic multilayer substrate is performed, the resin paste disappears. Regarding a resin contained in such a resin paste, a paste containing an appropriate resin that can disappear during firing may be used. Examples of the resin include polyethylene terephthalate (PET), polypropylene, and acrylic resins. In place of the resin paste, other materials, such as carbon and paraffin, which disappear at a firing temperature may be used to form the cavity.

Figure 2:
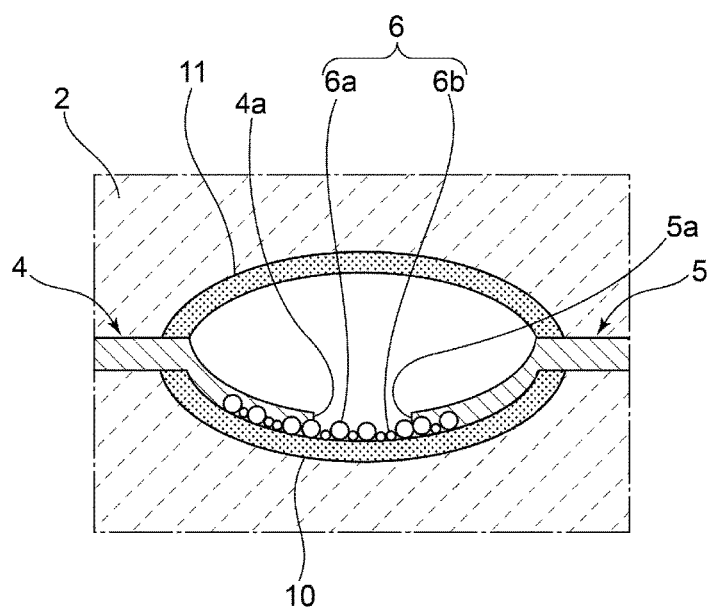
FIG. 2 is a fragmentary enlarged front sectional view of an ESD protection device according to an embodiment of the present disclosure.

In this embodiment, an auxiliary electrode 6 is arranged so as to connect the first and second discharge electrodes 4 and 5 to each other. As illustrated in FIG. 2 which is an enlarged view, the auxiliary electrode 6 has a structure in which metal particles 6a and semiconductor ceramic particles 6b are dispersed, the metal particles 6a having surfaces coated with a non-conductive inorganic material.

Returning to FIG. 1, in this embodiment, a lower seal layer 10 is arranged below the cavity 3. The foregoing auxiliary electrode 6 is arranged on the lower seal layer 10. An upper seal layer 11 is arranged on the upper side of the cavity 3. The lower seal layer 10 and the upper seal layer 11 are composed of a ceramic having a higher sintering temperature than that of a ceramic contained in the ceramic multilayer substrate 2. The lower seal layer 10 and the upper seal layer 11 may be not necessarily arranged.

The first discharge electrode 4 is electrically connected to a first outer electrode 12 in a portion which is not illustrated, the first outer electrode 12 being arranged on an outer surface of the ceramic multilayer substrate 2. Similarly, the second discharge electrode 5 is electrically connected to a second outer electrode 13 in a portion which is not illustrated, the second outer electrode 13 being arranged on an outer surface of the ceramic multilayer substrate 2.

The ESD protection device 1 according to this embodiment is characterized in that each of the first and second discharge electrodes 4 and 5 contains a metal and a shrinkage suppression material. The shrinkage suppression material is a material having a lower rate of shrinkage than that of the metal contained in the discharge electrodes at a temperature at which firing for the production of the ceramic multilayer substrate 2 is performed.

The shrinkage suppression material is not particularly limited as long as the rate of shrinkage of the shrinkage suppression material at a firing temperature is lower than that of the metal contained in the discharge electrodes 4 and 5. To withstand the firing temperature, the shrinkage suppression material is preferably composed of an inorganic substance. More preferably, the shrinkage suppression material is composed of a semiconductor. In the case of the shrinkage suppression material composed of a semiconductor, the first and second discharge electrodes 4 and 5 are less likely to have low conductivity. The semiconductor may be a carbide, for example, titanium carbide, zirconium carbide, molybdenum carbide, or tungsten carbide; a nitride, for example, titanium nitride, zirconium nitride, chromium nitride, vanadium nitride, or tantalum nitride; a silicide, for example, titanium silicide, zirconium silicide, tungsten silicide, molybdenum silicide, or chromium silicide; a boride, for example, titanium boride, zirconium boride, chromium boride, lanthanum boride, molybdenum boride, or tungsten boride; or an oxide, for example, zinc oxide or strontium titanate. These semiconductors may be used alone or in combination of two or more.

The shrinkage suppression material may be an insulating material, such as alumina.

In the ESD protection device 1 according to this embodiment, the first and second discharge electrodes 4 and 5 are less likely to shrink during firing for the production of the ceramic multilayer substrate 2 because the shrinkage suppression material is contained. Thus, the gap between the end 4a of the first discharge electrode 4 and the end 5a of the second discharge electrode 5 is less likely to be increased during the firing. This suppresses an increase in the discharge starting voltage. It is thus possible to surely provide the ESD protection device 1 having a low discharge starting voltage.

In this embodiment, the auxiliary electrode 6 is arranged. This also enables the discharge starting voltage to be decreased.

In this embodiment, the auxiliary electrode 6 has the structure in which the metal particles 6a and the semiconductor ceramic particles 6b are dispersed, the metal particles 6a having the surfaces coated with the non-conductive inorganic material, as illustrated in FIG. 2 which is an enlarged view. The auxiliary electrode 6 has such a dispersion structure. Specifically, the auxiliary electrode 6 may be formed by applying a paste containing the metal particles 6a having the surfaces coated with the non-conductive inorganic material, the semiconductor ceramic particles 6b, and a binder, and baking the paste.

The auxiliary electrode 6 may contain only a conductive material coated with a non-conductive inorganic material. Also, in that case, the discharge starting voltage can be effectively reduced. As described above, the auxiliary electrode 6 preferably contains the conductive material and the ceramic material, the conductive material being coated with the non-conductive inorganic material. More preferably, the auxiliary electrode 6 contains the conductive material and the semiconductor material, the conductive material being coated with the non-conductive inorganic material, as described above. This enables a further reduction in discharge starting voltage.

Although the first discharge electrode 4 and the second discharge electrode 5, i.e., a pair of discharge electrodes 4 and 5, are illustrated in FIG. 1, a plurality of pairs of discharge electrodes may be arranged in the ESD protection device according to the present disclosure. Also, in that case, according to the present disclosure, the discharge starting voltage can be effectively reduced, provided that each of the discharge electrodes contains the shrinkage suppression material.

In the ESD protection device 1, the first and second discharge electrodes 4 and 5 face each other at one height position in the ceramic multilayer substrate 2. Alternatively, at least one pair of discharge electrodes that face each other may be arranged at a plurality of height positions. That is, a pair of discharge electrodes that face each other may be arranged at another height position in addition to the first and second discharge electrodes 4 and 5.

A ceramic material contained in the ceramic multilayer substrate is not limited to a BAS material. Examples of a material that may be appropriately used include forsterite to which glass is added; and a ceramic in which glass is added to $CuZrO_3$.

The semiconductor material used for the auxiliary electrode 6 is not limited to silicon carbide. Carbide, such as titanium carbide, a nitride, such as titanium nitride, a silicide, such as titanium silicide, a boride, such as titanium boride, or an oxide, such as lead oxide, may be used. One semiconductor ceramic material may be used alone. Alternatively, two or more semiconductor ceramic materials may be used in combination.

The metal material contained in the first and second discharge electrodes 4 and 5 and the outer electrodes is not particularly limited. The metal material is not limited to Cu. Ag, Pd, Pt, Al, Ni, W, or an alloy mainly containing one of the metals may be used. Furthermore, a semiconductor material, such as SiC, may be used as an electrode material.

The non-conductive material with which the conductive material is coated is not particularly limited as long as it does not have conductivity. Preferably, an inorganic material is used. Examples of the inorganic material include $Al_2O_3$, $Zr_2O_3$, and $SiO_2$. A mixture, such as a BAS material, may be used.

Next, specific experimental examples will be described.

(Ceramic Green Sheet)

A BAS material having a composition mainly containing Ba, Al, and Si was prepared as a ceramic material. Toluene serving as an organic solvent was added to a ceramic powder composed of the BAS material, followed by stirring of the resulting mixture. A binder and a plasticizer were added thereto. The resulting mixture was stirred to form a slurry. The slurry was formed into mother ceramic green sheets each having a thickness of 50 μm by a doctor blade method.

(Paste for Auxiliary Electrode)

A Cu powder with an average particle diameter of about 2 μm, the Cu powder being coated with $Al_2O_3$, and a SiC powder with an average particle diameter of about 0.5 μm were mixed together in a weight ratio of 1 to 10. Furthermore, a binder resin and a solvent were added thereto, followed by stirring of the mixture. In this way, a paste for the auxiliary electrode was prepared. In the paste for the auxiliary electrode, the components were mixed in such a manner that the binder resin and the solvent accounted for 20% by weight and that the Cu powder and the SiC powder accounted for 80% by weight.

(Paste for Discharge Electrode)

A Cu powder having an average particle diameter of about 2 μm and an $Al_2O_3$ powder, which is an inorganic powder, serving as a shrinkage suppression material were weighed in ratios listed in Table 1. A binder resin and an organic solvent were added thereto. The resulting mixtures were stirred to produce pastes 1 to 10 for the discharge electrodes. The $Al_2O_3$ powder used had an average particle diameter of about 0.5 μm.

In each of the pastes for the discharge electrodes produced as described above, the binder resin and the organic solvent accounted for 20% by weight, and the Cu powder and the $Al_2O_3$ powder accounted for 80% by weight.

TABLE 1

| Paste No. | Weight ratio (percent by weight) | |
|---|---|---|
| | Cu powder | $Al_2O_3$ powder |
| 1 | 100 | 0 |
| 2 | 97 | 3 |
| 3 | 95 | 5 |
| 4 | 90 | 10 |
| 5 | 85 | 15 |
| 6 | 80 | 20 |
| 7 | 75 | 25 |
| 8 | 70 | 30 |
| 9 | 65 | 35 |
| 10 | 60 | 40 |

(Paste for Forming Cavity)

A paste prepared by mixing 40% by weight of a cross-linked acrylic resin beads having an average particle diameter of 1 μm and 60% by weight of an organic vehicle, which was prepared by dissolving ethyl cellulose in dihydroterpinyl acetate, and kneading the resulting mixture was used as a resin paste for forming the cavity 3.

(Production Process)

In a production process described below, steps before the formation of multilayer bodies for ceramic multilayer substrates of individual ESD protection devices were performed in a state of a mother multilayer body.

The paste for the auxiliary electrode was applied by screen printing on a mother ceramic green sheet. The paste for the discharge electrodes was then applied to form first and second discharge electrode portions. Here, the paste for the discharge electrodes was applied by printing in such a manner that each of the discharge electrodes had a width of 100 μm and the dimension of the gap between the first and second discharge electrodes was 30 μm. The resin paste for forming the cavity was then applied.

Next, the plurality of the mother ceramic green sheets were stacked on each of the upper and lower sides of the ceramic green sheet on which the paste for the auxiliary electrode, the paste for the first and second discharge electrodes, and the resin paste were applied by printing. The resulting stack was subjected to pressure bonding, thereby providing a mother multilayer body having a thickness of 0.3 mm.

The mother multilayer body was cut in the thickness direction into individual ceramic multilayer bodies for ESD protection devices. In this way, ceramic multilayer bodies having dimensions of 1.0 mm×0.5 mm×0.3 mm in thickness were provided. Next, a conductive paste for forming outer electrodes was applied to both end faces of each of the ceramic multilayer bodies.

Subsequently, each of the ceramic multilayer bodies was fired in nitrogen gas to provide the ESD protection device 1. That is, each of the ceramic multilayer bodies was fired to provide the ceramic multilayer substrate 2 and to allow the resin paste to disappear, thereby forming the cavity 3. Furthermore, by the firing, the paste for the auxiliary electrode and the paste for the discharge electrodes were baked to form the auxiliary electrode 6 and the first and second discharge electrodes 4 and 5.

The ESD protection devices were produced as described above.

Note that as the paste for the discharge electrodes, pastes 1 to 10 listed in Table 1 were used to produce samples 1 to 10 of the ESD protection devices.

For each sample, the discharge responsiveness of 100 ESD protection devices produced as described above was evaluated. That is, the discharge responsiveness was evaluated by an electrostatic discharge immunity test specified in IDC 61000-4-2. The evaluation was performed using the following evaluation symbols each corresponding to the magnitude of a peak voltage detected on the side of a protective circuit. Table 2 lists the results.

Δ: At a peak voltage of 700 V or more, the discharge responsiveness is rated as good.

○: At a peak voltage of 500 V or more and less than 700 V, the discharge responsiveness is rated as better.

☉: At a peak voltage less than 500 V, the discharge responsiveness is rated as excellent.

After the paste for the discharge electrodes, the paste being used for the formation of the first and second discharge electrodes, was applied by printing on the ceramic green sheet, the dimension of the gap between the discharge electrodes was measured at 6 positions. The average of the measurements was determined. That is, the dimension of the actual gap after printing was determined with respect to a design value of 30 μm. Table 2 lists the results.

For each sample, 10 ESD protection devices finally produced after firing were drawn and polished to expose discharge portions. The gaps between the exposed discharge electrodes were measured. The average and the maximum of the measurements of the 10 gaps were determined. Table 2 lists the results.

TABLE 2

| Sample No. | Paste No. | Weight ratio (percent by weight) Cu powder | Weight ratio (percent by weight) Al$_2$O$_3$ powder | ESD discharge responsiveness | Gap after printing (μm) Average | Gap after printing (μm) Maximum | Gap after firing (μm) Average | Gap after firing (μm) Maximum |
|---|---|---|---|---|---|---|---|---|
| 1 | 1 | 100 | 0 | ○ | 29.4 | 31.1 | 60 | 70.1 |
| 2 | 2 | 97 | 3 | ⊙ | 28.9 | 31 | 53.3 | 68.9 |
| 3 | 3 | 95 | 5 | ⊙ | 29.2 | 30.8 | 48.7 | 63.2 |
| 4 | 4 | 90 | 10 | ⊙ | 28.9 | 31.2 | 44.2 | 58.8 |
| 5 | 5 | 85 | 15 | ⊙ | 29.9 | 30.9 | 42.3 | 54.6 |
| 6 | 6 | 80 | 20 | ○ | 29.4 | 31 | 40.3 | 49.4 |
| 7 | 7 | 75 | 25 | ○ | 28.5 | 30.6 | 38.5 | 44.9 |
| 8 | 8 | 70 | 30 | △ | 29.2 | 30.7 | 35.4 | 41.5 |
| 9 | 9 | 65 | 35 | △ | 29 | 31.3 | 32.9 | 40.1 |
| 10 | 10 | 60 | 40 | △ | 29.7 | 32.2 | 32.5 | 36.9 |

Table 2 demonstrates that the incorporation of Al$_2$O$_3$ inhibits an increase in gap and enhances the discharge responsiveness, compared with the case where Al$_2$O$_3$ is not contained. It is also found that the Al$_2$O$_3$ powder is preferably in the range of 2% to 15% by weight with respect to 100% by weight of the total of the Cu powder and the Al$_2$O$_3$ powder. Within this range, the shrinkage is suppressed to enhance the discharge responsiveness. Furthermore, the content of Al$_2$O$_3$, which is an insulating material, is not too high. Thus, good discharge responsiveness is obtained.

1 ESD protection device
2 ceramic multilayer substrate
3 cavity
4, 5 discharge electrode
4a, 5a end
6 auxiliary electrode
6a metal particle
6b semiconductor ceramic particle
10 lower seal layer
11 upper seal layer
12 first outer electrode
13 second outer electrode

The invention claimed is:

1. An ESD protection device comprising:
a ceramic multilayer substrate; and
a first discharge electrode and a second discharge electrode arranged at a height position of the ceramic multilayer substrate, an end of the first discharge electrode and an end of the second discharge electrode facing each other,
wherein each of the first discharge electrode and the second discharge electrode comprises a metal and a shrinkage suppression material, a shrinkage rate of the shrinkage suppression material being lower than a shrinkage rate of the metal at a firing temperature for producing the ceramic multilayer substrate.

2. The ESD protection device according to claim 1, wherein the shrinkage suppression material comprises an inorganic substance, a sintering temperature of the inorganic substance being higher than a sintering temperature of the metal.

3. The ESD protection device according to claim 1, wherein the shrinkage suppression material is a semiconductor.

4. The ESD protection device according to claim 1, wherein the shrinkage suppression material is an insulating material.

5. The ESD protection device according to claim 1, further comprising an auxiliary electrode arranged in the ceramic multilayer substrate, the auxiliary electrode being connected to the first discharge electrode and the second discharge electrode, wherein the auxiliary electrode comprises a conductive material coated with an insulating material.

6. The ESD protection device according to claim 5, wherein the auxiliary electrode further comprises a ceramic material.

7. The ESD protection device according to claim 6, wherein the ceramic material is a semiconductor ceramic.

* * * * *